(12) United States Patent
Chiang et al.

(10) Patent No.: US 11,631,319 B2
(45) Date of Patent: *Apr. 18, 2023

(54) RESISTOR-CAPACITOR SENSOR CIRCUIT

(71) Applicant: Micron Technology, Inc., Boise, ID (US)

(72) Inventors: Pin-Chou Chiang, San Jose, CA (US); Michele Piccardi, Cupertino, CA (US); Theodore T. Pekny, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 15 days.

This patent is subject to a terminal disclaimer.

(21) Appl. No.: 17/369,816

(22) Filed: Jul. 7, 2021

(65) Prior Publication Data

US 2021/0335125 A1    Oct. 28, 2021

Related U.S. Application Data

(63) Continuation of application No. 16/721,168, filed on Dec. 19, 2019, now Pat. No. 11,074,805.

(51) Int. Cl.
*G08B 29/12* (2006.01)
*G08B 29/06* (2006.01)
*H03K 17/18* (2006.01)

(52) U.S. Cl.
CPC .......... *G08B 29/123* (2013.01); *G08B 29/06* (2013.01); *H03K 17/18* (2013.01)

(58) Field of Classification Search
None
See application file for complete search history.

(56) References Cited

U.S. PATENT DOCUMENTS

| | | | | | |
|---|---|---|---|---|---|
| 4,065,683 | A | * | 12/1977 | Clarke | H03K 5/003 326/89 |
| 5,444,590 | A | * | 8/1995 | LeComte | H03K 17/18 361/103 |
| 5,589,802 | A | * | 12/1996 | O'Shaughnessy | G01R 27/14 331/65 |
| 5,594,388 | A | * | 1/1997 | O'Shaughnessy | H03K 3/03 331/8 |

(Continued)

OTHER PUBLICATIONS

International Search Report and Written Opinion for Application No. PCT/US2020/065779, dated Apr. 6, 2021.

(Continued)

*Primary Examiner* — Fekadeselassie Girma
(74) *Attorney, Agent, or Firm* — Lowenstein Sandler LLP (57) ABSTRACT

A resistor-capacitor (RC) sensor circuit includes an integration capacitor configured to integrate a representative copy of a current that drives an electronic circuit line. The integration capacitor is configured to integrate over a first time period to generate a first representative voltage and over a second time period to generate a second representative voltage. The RC sensor circuit includes a sampling circuit coupled to the integration capacitor and configured to sample the first representative voltage and the second representative voltage. A ratio of the first sampled voltage and the second sampled voltage is indicative of an RC time constant of the electronic circuit line.

20 Claims, 7 Drawing Sheets

(56) References Cited

U.S. PATENT DOCUMENTS

| | | | | |
|---|---|---|---|---|
| 5,694,282 | A * | 12/1997 | Yockey | H03K 17/0822 361/101 |
| 6,292,052 | B1 * | 9/2001 | Carlson | H04L 25/03885 330/109 |
| 6,392,219 | B1 * | 5/2002 | McCormick | H04L 25/03885 250/214 R |
| 8,467,749 | B2 * | 6/2013 | Ozgun | H03F 3/195 455/127.2 |
| 9,341,501 | B1 * | 5/2016 | Boatman | G01K 13/02 |
| 10,158,355 | B2 * | 12/2018 | Gangopadhya | H03K 17/6874 |
| 10,203,707 | B2 * | 2/2019 | Teggatz | H03K 17/6871 |
| 10,461,736 | B2 * | 10/2019 | Kato | H02M 1/08 |
| 11,074,805 | B2 * | 7/2021 | Chiang | G08B 29/123 |
| 2002/0167433 | A1 * | 11/2002 | Soundarapandian | H03M 1/002 341/155 |
| 2003/0086304 | A1 | 5/2003 | Park | |
| 2003/0107322 | A1 * | 6/2003 | Melvin | H03K 17/785 315/77 |
| 2006/0255812 | A1 * | 11/2006 | Martin | H01H 9/167 324/609 |
| 2006/0267665 | A1 * | 11/2006 | Kawamoto | H03K 4/00 327/427 |
| 2007/0007929 | A1 * | 1/2007 | Lee | H02P 27/06 318/802 |
| 2012/0112775 | A1 * | 5/2012 | Domes | H03K 17/18 327/438 |
| 2013/0147495 | A1 * | 6/2013 | Galera | G08B 29/06 324/658 |
| 2013/0222054 | A1 * | 8/2013 | Yendluri | H03H 11/02 327/552 |
| 2013/0257177 | A1 * | 10/2013 | Jacobson | H03K 17/04123 307/115 |
| 2014/0265899 | A1 * | 9/2014 | Sadwick | H05B 45/395 315/200 R |
| 2014/0265935 | A1 * | 9/2014 | Sadwick | H05B 45/56 315/307 |
| 2014/0300274 | A1 * | 10/2014 | Acatrinei | H05B 45/38 315/122 |
| 2015/0057822 | A1 * | 2/2015 | Baldridge | H03K 17/0822 700/293 |
| 2016/0078958 | A1 | 3/2016 | Wang et al. | |
| 2017/0143969 | A1 * | 5/2017 | Sarpeshkar | A61N 1/36071 |
| 2017/0346419 | A1 * | 11/2017 | Bogus | H03K 17/687 |
| 2017/0346434 | A1 * | 11/2017 | Faschang | H02P 5/74 |
| 2018/0270435 | A1 * | 9/2018 | Chow | G06V 10/754 |
| 2019/0004111 | A1 | 1/2019 | Miwa | |
| 2019/0097628 | A1 * | 3/2019 | Klappauf | H02P 29/02 |
| 2019/0109057 | A1 | 4/2019 | Hargan et al. | |
| 2019/0350053 | A1 * | 11/2019 | Miskin | H03K 17/962 |
| 2021/0335125 | A1 * | 10/2021 | Chiang | G11C 29/50012 |

OTHER PUBLICATIONS

International Search Report and Written Opinion dated Mar. 15, 2021, on application No. PCT/US2020/065780.

* cited by examiner

RESISTOR-CAPACITOR SENSOR CIRCUIT

RELATED APPLICATION

This application is a continuation of U.S. patent application Ser. No. 16/721,168 filed on Dec. 19, 2019, the entire contents of which are hereby incorporated by reference herein.

TECHNICAL FIELD

Embodiments of the disclosure relate generally to resistor-capacitor sensor circuits, and more specifically, resistor-capacitor sensor circuits for extracting the resistor-capacitor time constants of electronic circuit lines.

BACKGROUND

The propagation of a signal across a wire or other circuit can be dominated by resistive-capacitive effects. Resistive-capacitive delay, or RC delay, can hinder the speed of electronic devices, such as microelectronic integrated circuits. RC delay can become a significant obstacle to performance improvements, especially in view of the continued feature scaling and feature density of electronic devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

An electronic circuit line can refer to a physical line or wire having some length over which a signal, such as a voltage signal or current signal, can be conducted. Examples of an electronic circuit line can include, but are not limited to, a wordline of memory device, a transmission line, a circuit interconnect, or any signal line of an electronic device. An electrical circuit line can be associated with some amount of resistance and capacitance, such as parasitic resistance and parasitic capacitance, which can contribute to resistance-capacitance (RC) delay of a signal being transmitted or propagated across an electronic circuit line. The RC delay can be characterized by an RC time constant (in seconds). The RC time constant is equal to the product of resistance and capacitance. For example, an electronic circuit line can include at least two ends, a near end and a far end opposite the near end. When a voltage signal is driven at the near end of the electronic circuit line the propagation of the signal to the far end of the electronic circuit line can be delayed proportional to the RC time constant of the electronic circuit line.

The RC delay of an electronic circuit line can inhibit the performance of many electronic devices. For example, in a memory device a voltage signal can be applied to a wordline to perform a memory operation, such as a read operation or program operation. If the RC delay is large and the magnitude or duration of the voltage signal is not adequate to address the RC delay, significant latency can be introduced in the performance of the memory operation.

In some systems, the RC time constant and RC delay of an electronic circuit line can be obtained by direct measurements at the near end and the far end of the electronic circuit line. With a known RC time constant, the drive voltage of an electronic circuit line can be adjusted to address issue the associated RC delay.

As the feature size of electronic devices continues to shrink and feature density increases, direct measurements at an electronic circuit line to obtain the electronic circuit line's RC time constant and RC delay is unavailable. Moreover, the distribution of RC time constants across electronic circuit lines of the same electronic device and across electronic circuit lines of different electronic devices of the same device type can be random, which makes compensating for the RC delay of electronic circuit lines particularly challenging.

Aspects of the disclosure address the above and other deficiencies by implementing an RC sensor circuit that can extract or extrapolate RC time constant information of an electronic circuit line using a representative copy of a current that drives the electronic circuit line.

In some embodiments, an RC sensor circuit can be driven to a certain voltage using a representative copy of the current that drives the electronic circuit line. The representative copy of the current can be integrated at an integration capacitor of the RC sensor circuit. At various times the voltage at the integration capacitor can be sampled to obtain at least two sample voltages. For example, the integration capacitor can be sampled at a first time ($t1$) before the voltage at the integration capacitor reaches a steady-state voltage, and at a second time ($t2$) where the voltage at the integration capacitor is at or near the steady-state voltage. The sampled voltages obtained at the RC sensor circuit can be indicative of voltages that would have been developed at the far end of the electronic circuit line at respective times, $t1$, and $t2$, had the electronic circuit line been driven to the drive voltage using a similar current. The ratio of the first sampled voltage and the second sampled voltage obtained at the RC sensor circuit can have a one-to-one mapping to the RC time constant of the electronic circuit line. In some embodiments, the ratio can be used to select or adjust an operating voltage that can be used to drive the electronic circuit line and compensate for the extracted RC delay of the electronic circuit line.

Advantages of the disclosure include, but are not limited to, determining RC information, such as the RC time constant or RC delay, of an electronic circuit line where direct measurement of the RC time constant or RC delay at the electronic circuit line is unavailable. Additionally, the RC information can be used to improve the performance of electronic devices, such as memory devices, among others. For example, the RC information drive signals can be adjusted for electronic circuit lines to compensate for RC delay, which improves latency and performance in many electronic devices.

Figure 1:
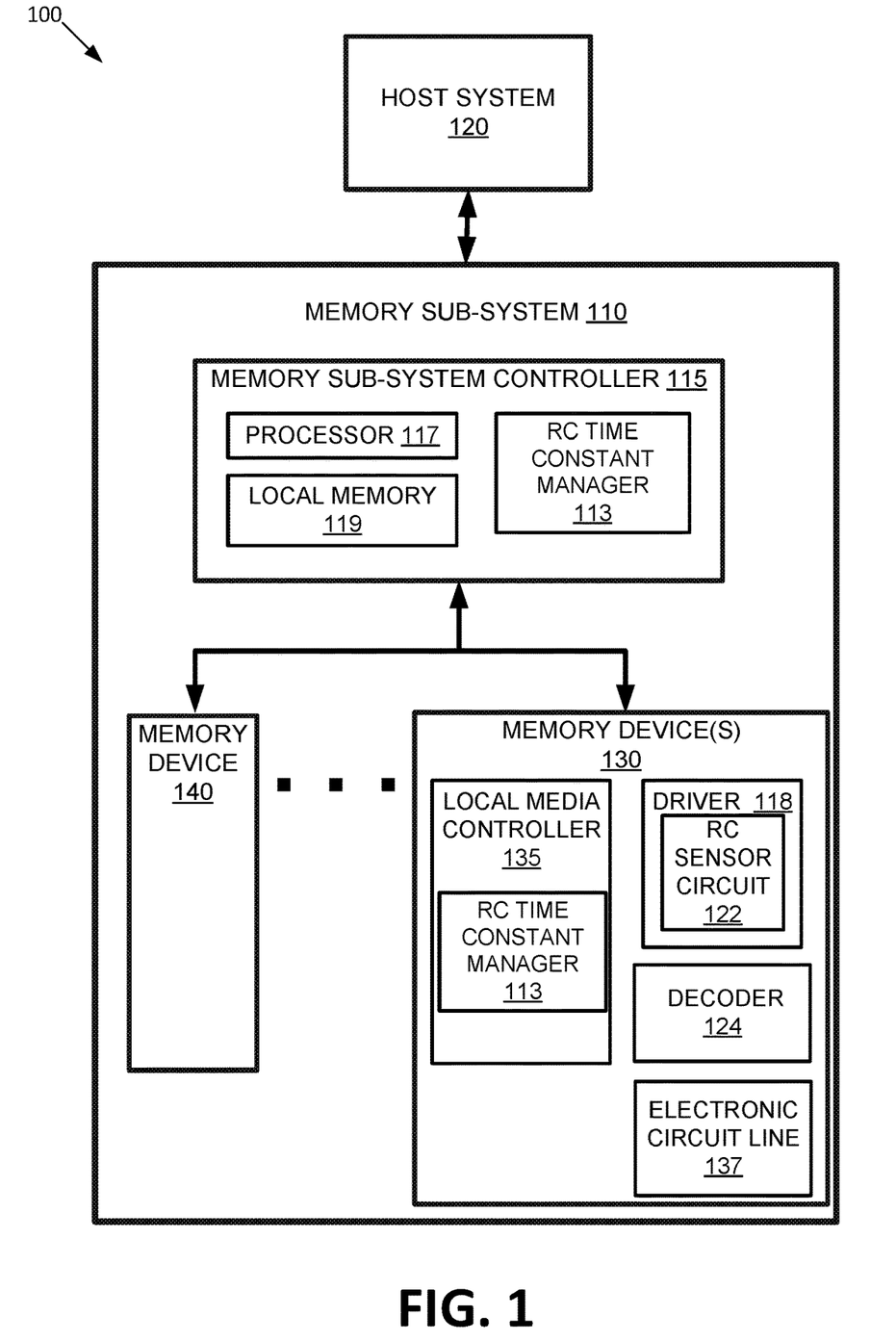
FIG. 1 illustrates an example computing environment that includes a memory sub-system, in accordance with some embodiments of the disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells such as single level cells (SLCs) or multi-level cells (MLCs) (e.g., triple level cells (TLCs) or quad-level cells (QLCs)). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

In some embodiments, the memory operations can include but are not limited to a program operation (e.g., write operation), a read operation, or an erase operation. In some embodiments, a program operation can include multiple sub-operations such as a program sub-operation, a read sub-operation, and a verify sub-operation. A program sub-operation programs data to memory cells. The data to be programmed can also be stored in one or more registers of the memory device 130. The read operation reads the data programmed at the memory cells. The verify operation confirms that the input data is properly programmed (e.g. written) at the memory cells. For example, to perform the verify operation the read data from the read operation is compared to the original data stored in the registers.

In some embodiments, the memory sub-system 110 includes RC time constant manager 113. In some embodiments, RC time constant manager 113 of memory sub-system controller 115 performs the operations described herein. In some embodiments, RC time constant manager 113 of local media controller 135 performs the operations described herein. In some embodiments, RC time constant manager 113 of memory sub-system controller 115 and local media controller 135 work together to perfume the operations described herein. In some embodiments, any component of the computer environment can include RC time constant manager 113. For example, RC time constant manager 113 can be part of host system 120, memory device 140, memory device 130, or an operating system (OS) (e.g., OS of host system 120). In another example, the memory sub-system controller 115 can include a processor 117 (processing device) configured to execute instructions stored in local memory 119 for performing the operations described herein.

In some embodiments, memory device 130 can include one or more of a driver circuit 118 (also referred to as "driver" herein), decoder circuit 124 (also referred to as "decoder" herein), and RC sensor circuit 122. In some embodiments, RC sensor circuit 122 can be part of the driver circuit 118. In some embodiments, the memory device 130 can include one or more electronic circuit lines 137, such as wordlines. A wordline can refer to one or more rows of memory cells of a memory device that are used with one or more bitlines to generate the address of each of the memory cells. Driver circuit 118, decoder circuit 124, RC sensor circuit 122, electronic circuit lines 137, and RC time constant manager 113 are further described with respect to the following Figures. Components of FIG. 1 are used to help describe the following Figures.

It can be noted that aspects of the present disclosure are described with respect to memory sub-system 110 and memory device 130 for purposes of illustration, rather than limitation. It can be noted that aspects of the present disclosure can be applied to any electronic circuit line, including electronic circuit lines contain in or coupled to any types of electronic devices, such as but not limited to memory devices 130, memory device 140, and processing devices. Additionally, the RC time constant manager 113 is illustrated as part of memory sub-system controller 115 and memory device 130 for purposes of illustration, rather than limitation, and can be part of another component or a standalone module executed at a processing device, for example. Further details with respect to RC time constant manager 113 are described below.

Figure 2:
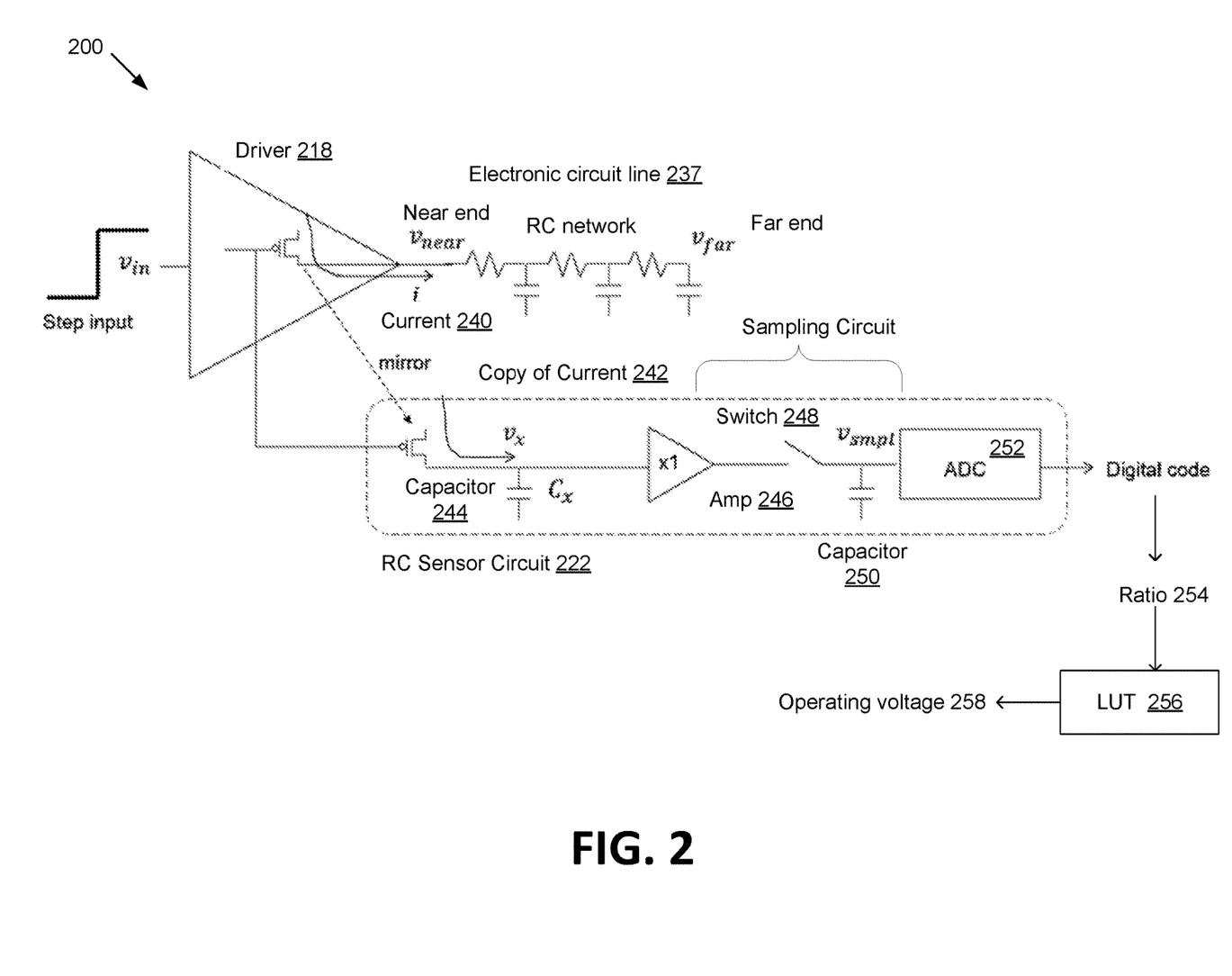
FIG. 2 is a diagram illustrating an RC sensor circuit and an example electronic circuit line, in accordance with some embodiments of the disclosure.

FIG. 2 is a diagram illustrating an RC sensor circuit and an example electronic circuit line, in accordance with some embodiments of the disclosure. Diagram 200 illustrates RC sensor circuit 222 (also referred to as "RC sensor" herein) and electronic circuit line 237.

Electronic circuit line 237 is represented by a resistor and capacitor network. The resistors and capacitors illustrated in the RC network can include one or more parasitic resistance of the electronic circuit line 237, parasitic capacitance of the electronic circuit line 237, resistance of electronic components of the electronic circuit line 237, or capacitance of electronic components of the electronic circuit line 237.

In some embodiments, the electronic circuit line 237 has a physical layout that includes two ends, a near end (e.g., source end) and a far end that is opposite the far end (e.g., load end). The far end can be some point at the electronic circuit line 237 any distance or length away from the near end. For example, the electronic circuit line 237 can be a wordline of a memory device 130. The wordline can include a first end (e.g., near end) that is coupled to driver circuit 218. The first end can be associated with an initial memory cell of the wordline the memory device 130. The second end (e.g., far end) can be the part of the wordline that is a furthest distance (or length) from the first end. The second end can be associated with the last memory cell of the wordline of the memory device 130.

In some embodiments, the near end is driven by a signal, such as a drive voltage or current 240. For example, an input voltage (e.g., Vin) can be supplied to the input of the driver circuit 218, and the output of the driver circuit 218 drives the electronic circuit line 237 to some drive voltage based on the input voltage. The current 240 represents the current that drives the electronic circuit line 237 to the drive voltage. In the present example, the driver circuit 218 drives the electronic circuit line 237 to a voltage equal to the input voltage.

Due to the resistance and capacitance of the electronic circuit line 237, the signal at the far end of the electronic circuit line 237 is delayed (e.g., RC delay). For example, the voltage (e.g., Vnear) at the near end of the electronic circuit line 237 can be driven to the drive voltage nearly instantaneously, but the voltage (e.g., Vfar) at the far end of the electronic circuit line 237 is driven to the drive voltage more slowly due to RC delay. The delay of a signal between an input at one end (e.g., near end) and output and another end (e.g., far end) can be referred to as RC delay. As noted above, the RC delay can be characterized by an RC time constant (in seconds). The RC time constant is equal to the product of circuit resistance and circuit capacitance, and is indicative of the time to charge a capacitor through a resistor from an initial voltage of zero Volts to approximately 63.2% of the voltage value of an applied direct current (DC) voltage.

In some embodiments, the far end of the electronic circuit line 237 is not accessible for measurement. For example, the far end of the wordline can have no conductive pads that are accessible to a probe or have no electrical couplings to an electronic circuit that can measure the voltage (Vfar) at the far end of the wordline.

In some embodiments, the RC sensor circuit 222 can be used to extract the RC time constant and estimate the RC delay of the electronic circuit line 237. In some embodiments, a representative copy of current 240 (herein after referred to as representative copy of the current 242) that is driven at electronic circuit line 237 is driven at RC sensor circuit 222. Representative copy of the current 242 can approximate (or be substantially similar) the current 240 that is driven at electronic circuit line 237 at any given time. The accuracy of the representative copy of the current 242 in approximating the current 240 can be based on design consideration. For example, the estimated RC is roughly linearly proportional to the accuracy of the representative copy of the current 242. If the tolerable error in the estimated RC time constant is 10% the accuracy of the representative copy of the current 242 can be equal to or greater than 90%. In some embodiments, the driver circuit 218 can drive both the electronic circuit line 237 and the RC sensor circuit 222. For example, driver circuit 218 can supply current 240 at electronic circuit line 237 and representative copy of the current 242 at RC sensor circuit 222. In some embodiments, driver circuit 218 can include a current mirror circuit. The current mirror circuit can supply current 240 to electronic circuit line 237 and mirror current 240 by providing a representative copy of the current 242 to RC sensor circuit 222. As illustrated, the two p-channel metal oxide semiconductor (PMOS) transistors each represent a half of the current mirror circuit. The gates of the PMOS transistors are coupled and both PMOS transistors are turned on responsive to the application of the input voltage (Vin). In some embodiments, various techniques can be implemented to reduce current mismatch of the current mirror. For example, the transistors can be long channel devices or be matched (e.g., layout matching) to reduce current mismatch.

It can be noted that driver circuit 218 is provided for purposes of illustration, rather than limitation. In other embodiments, driver circuit can be implemented as a different circuit type that provides current 240 and representative copy of the current 242. In still other embodiments, separate driver circuits can drive the electronic circuit line 237 and RC sensor circuit 222 with current 240 and representative copy of the current 242, respectively.

In some embodiments, RC sensor circuit 222 can include an integration capacitor 244. In some embodiments, the representative copy of the current 242 can be integrated at integration capacitor 244. Integration capacitor 244 can have two terminals. One terminal is coupled to the output of the driver circuit 218. Another terminal can be coupled to a ground potential, such as device ground or earth ground.

In some embodiments, RC sensor circuit 222 can include an amplifier 246. In some embodiments, amplifier 246 can include a unity-gain amplifier. In other embodiments, amplifier 246 can include an amplifier that amplifies the received signal at any factor. In some embodiments, the amplifier 246 includes an input and an output. The input of the amplifier 246 can be coupled to the integration capacitor 244 and the output of driver circuit 218. The output of the amplifier 246 can be coupled to sampling capacitor 250 via switch 248. In some embodiments, amplifier 246 can isolate the signal at the input-side of the amplifier 246 from the signal at the output-side of the amplifier 246. In some embodiments, amplifier 246 amplifies the voltage (e.g., Vx) stored at the integration capacitor 244 to produce a corresponding voltage at the output of the amplifier 246.

In some embodiments, the RC sensor circuit 222 includes a sampling circuit to sample the signal, e.g., voltage (Vx), stored at integration capacitor 244. The sampling circuit can sample the signal at different times such that the signal generated at integration capacitor 244 generated over different time periods can be sampled at the different times. In some embodiments, the sampling circuit includes a switch 248 and a sampling capacitor 250. The switch 248 can be a voltage-controlled switch that opens (e.g., illustrated) and closes responsive to an applied voltage. In some embodiments, the switch 248 can include a complementary metal-oxide-semiconductor (CMOS) switch, or other type of switch. The switch 248 can include at least two terminals. One terminal can be coupled to the output of the amplifier 246. Another terminal can be coupled to a terminal of the sampling capacitor 250. In some embodiments, the sampling capacitor 250 can include two terminals. One terminal can be coupled to a terminal of the switch 248 and the analog-to-digital converter (ADC) 252. Another terminal can be coupled to a ground potential.

In some embodiment, the switch 248 can be controlled such that the amplified signal from the output of the amplifier 246 can be stored at the sampling capacitor 250. For example, over a first time period (e.g., 0-2 microseconds (µs)) a voltage can develop at integration capacitor 244 responsive to charging by the representative copy of the current 242. For instance, the voltage (Vx) generated over the first time period can be a voltage before a steady-state voltage is developed at integration capacitor 244 (e.g., transient state). In some embodiments, to sample the voltage (Vx) stored at the integration capacitor 244 the switch 248 can close and so that the amplifier 246 charges the sampling capacitor 250 to a voltage (e.g., Vsmpl) that represents the voltage (e.g., Vx) stored at integration capacitor 244 at a particular time. When the desired voltage (e.g., Vsmpl) is stored at sampling capacitor 250 the switch 248 can open. In some embodiments, the above operations can be repeated to sample another voltage. For example, over a second time period (e.g., 0-20 µs), a new higher voltage can develop at integration capacitor 244 responsive to charging by the representative copy of the current 242. For instance, the voltage (Vx) developed over the second time period at integration capacitor 244 can reach a steady-state voltage. The switch 248 can close and the amplifier 246 charges the sampling capacitor 250 to a new voltage that represents the voltage (Vx) developed at integration capacitor 244 over the second time period. It can be noted that the first time period and the second time period can overlap.

In some embodiments, the RC sensor circuit 222 can include an ADC 252. The ADC 252 can include an input and an output. The input can be coupled to sampling capacitor 250 and the output can be coupled to look-up table (LUT) 256. The ADC 252 can convert an analog signal into a digital code. In some embodiments, the sampled voltage at sampling capacitor 250 can be converted by ADC 252 into digital codes. For example, the first sampled voltage that represents the voltage (e.g., Vx) at integration capacitor 244 developed over a first time period can be transformed to a first digital code by the ADC 252. The second sampled voltage that represents the voltage at the integration capacitor 244 developed over the second time period can be transformed to a second digital code by the ADC 252.

In some embodiments, the ratio of the two sampled voltages (e.g., Vsmpl) are indicative of the RC time constant of the electronic circuit line 237. In some embodiments, the ratio can be the ratio 254 of the respective digital codes. Equation 1 illustrates the ratio's relationship to the RC time constant. "r" represents the ratio, "V$_x$(t)" represents the voltage at the integration capacitor 244 at a particular time, "t$_1$" and "t$_2$" represent two different times or time periods, and RC represents the lumped estimate of the RC time constant of the electronic circuit line 237.

$$r = \frac{V_x(t_1)}{V_x(t_2)} = \frac{1 - e^{-\frac{t_1}{RC}}}{1 - e^{-\frac{t_2}{RC}}} = 1 - e^{-\frac{t_1}{RC}} \text{ if } t_2 >> RC \quad \text{Equation 1}$$

In some embodiments, the ratio 254 can be used as input into a look-up table (LUT) 256. LUT 256 can map the ratio 254 to an operating voltage 258 used to drive the electronic circuit line 237 in view of the extracted RC time constant of the electronic circuit line 237. For example, the different ratios can be mapped to different RC time constants or RC delays of the electronic circuit line 237 via test or simulation. With the estimated RC time constants, the ratios can be further mapped to an operating voltage that can adequately drive the electronic circuit line 237 in the desired amount of time to a particular voltage. The LUT 256 can store information that maps a determined ratio to a corresponding operating voltage. The operating voltage can be a voltage used to drive the electronic circuit line 237 to perform a particular operation.

In some embodiments, the operational voltage can represent an overdrive voltage used to drive the electronic circuit line 237. In some embodiments, the operational voltage can be associated with one or more of a voltage trim or program time. The voltage trim can refer a digital code that can identify the voltage level at which the electronic circuit line 237 is to be driven. In some embodiments, the program time can indicate the length of time at which the electronic circuit line 237 is to be driven at the voltage level identified by the voltage trim. For example, the voltage trim can identify the operational voltage to be 5V and the program time to be 10 us. The electronic circuit line 237 can be driven at 5V for 10 us (after which the voltage can be decreased to an original operating voltage of 2.5V, for example).

In an illustrative example, the electronic circuit line 237 is a wordline of a memory device 130. The RC of the wordline can be estimated using the operations described above. The ratio of sampled voltages can be used as input to the LUT 256. The output of the LUT 256 can provide a trim voltage and program time used to perform a memory operation, such as a program operation or read operation, at the wordline of the memory device 130. The operations can be repeated for one or more wordlines of the memory device 130.

In some embodiments, the electronic circuit line 237 and one or more components of the RC sensor circuit 222 can be part of an electronic device. In other embodiments, the electronic circuit line 237 and one or more components of the RC sensor circuit 222 can be part of different electronic devices. In some embodiments, one or more components of the RC sensor circuit 222 can be part of different electronic devices or the same electronic device. In an illustrative example, the electronic circuit line 237, driver circuit 218, integration capacitor 244, amplifier 246, switch 248, and sampling capacitor 250 can be on the electronic circuit, and the ADC 252 and LUT 256 can be part of one or more different electronic circuits.

Figure 3:
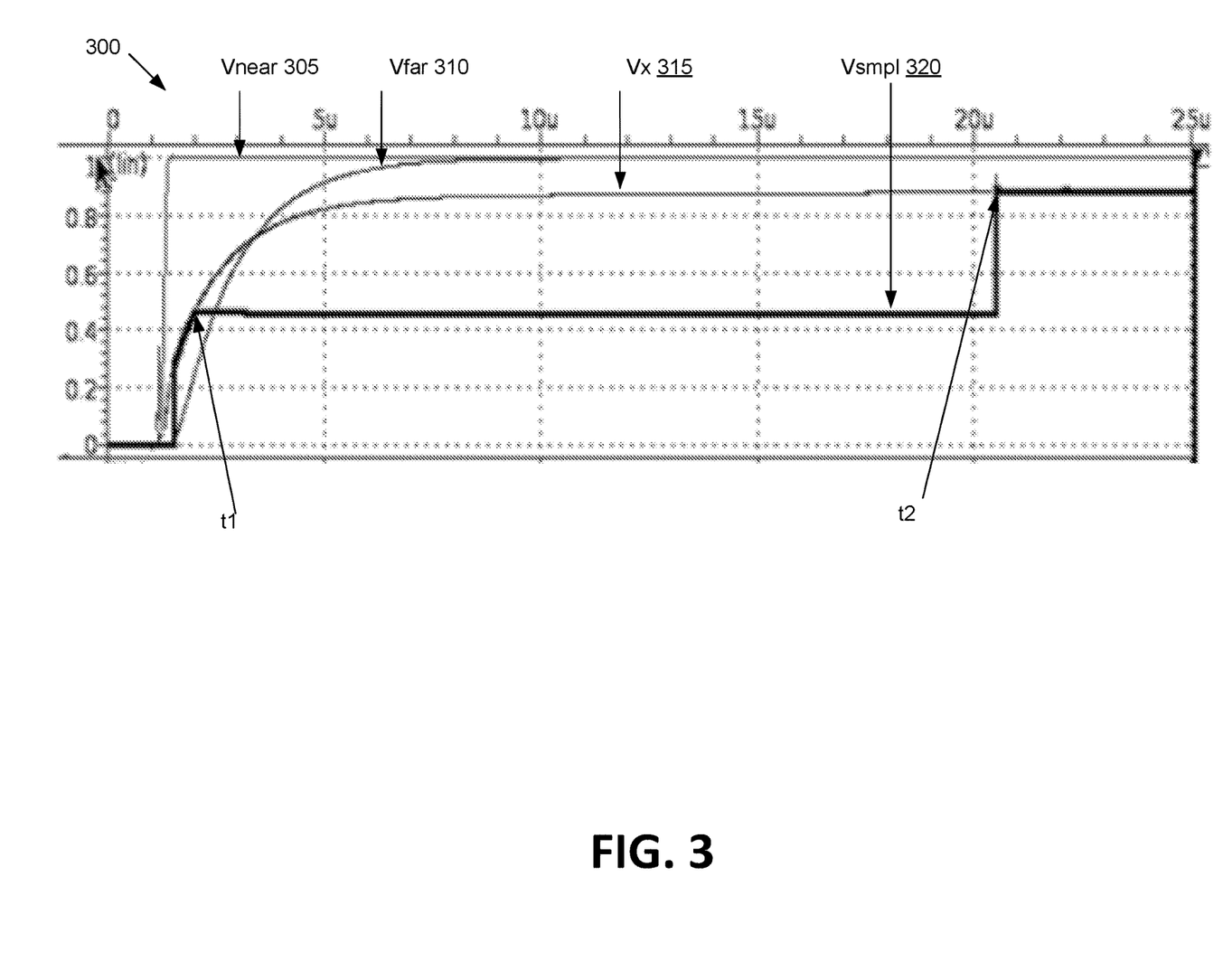
FIG. 3 illustrates a voltage waveform graph illustrating example waveforms at the electronic circuit line and RC sensor circuit, in accordance with some embodiments of the disclosure.

FIG. 3 illustrates a voltage waveform graph illustrating example waveforms at the electronic circuit line and RC sensor circuit, in accordance with some embodiments of the disclosure. Components of FIG. 2 are used to help illustrate FIG. 3.

Waveform graph 300 shows waveforms for Vnear 305, Vfar 310, Vx 315, and Vsmpl 320. The aforementioned voltages correspond to the voltages and nodes shown in FIG. 2. It can be noted that Vnear 305 of the electronic circuit line 237 reaches the steady-state voltage very quickly and Vfar 310 of the electronic circuit line 237 reaches the steady-state voltage with delay due to the RC delay of the electronic circuit line 237. As illustrated, the voltage waveform of Vx 315 at the integration capacitor 244 of the RC sensor circuit 222 is similar to the voltage waveform of Vfar 310, and mimics the RC delay of the electronic circuit line 237. Vsmpl 320 shows two samples of Vx 315 at two different times (e.g., t1 and t2).

Figure 4:
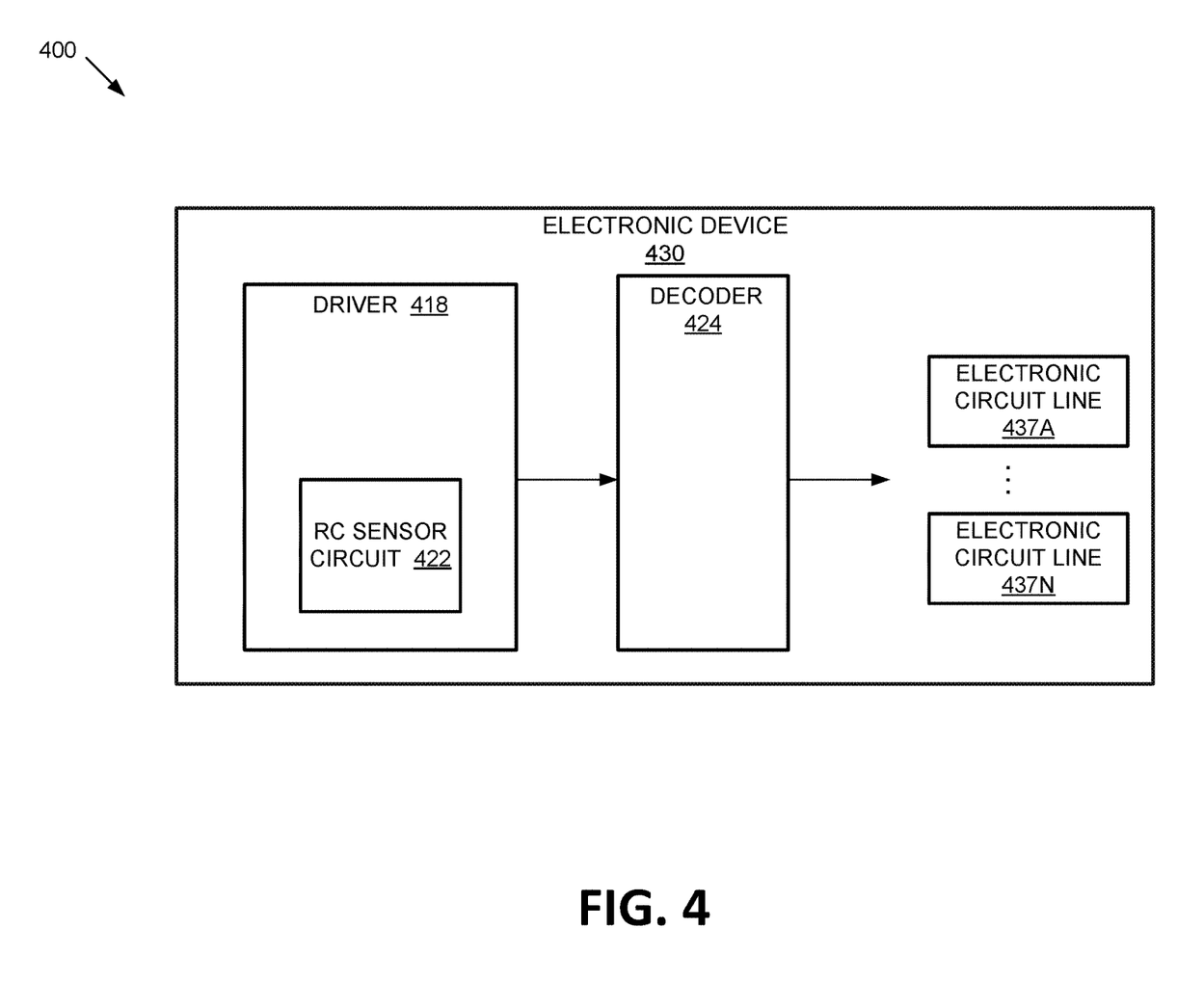
FIG. 4 is a block diagram illustrating circuitry to implement an RC sensor circuit at multiple electronic circuit lines, in accordance with some embodiments of the disclosure.

FIG. 4 is a block diagram illustrating circuitry to implement an RC sensor circuit at multiple electronic circuit lines, in accordance with some embodiments of the disclosure. Diagram 400 includes and electronic circuit that include a driver circuit 418, decoder 424, and multiple electronic circuit lines 437A-437N (also generally referred to as "electronic circuit line(s) 437"). In some embodiments, driver circuit 418 can include RC sensor circuit 422. In other embodiments, RC sensor circuit 422 can be separate from driver circuit 418. In the current example, driver circuit 418, decoder 424, and electronic circuit lines 237 are part of electronic device 430. In other embodiments, one or more of driver circuit 218, decoder 424, or electronic circuit lines 237 can be part of one or more different electronic devices. For example, electronic circuit lines 237 can be contained in a discrete semiconductor package and the driver circuit 218 and decoder 424 can be contained in one or more different discrete semiconductor packages.

In some embodiments, the RC time constant can be extracted (e.g., estimated) for different electronic circuit lines 437 by implementing a decoder 424. For instance, decoder 424 can be operated to select a first electronic circuit line, such as electronic circuit line 437A. The operations to determine the ratio indicative of the RC time constant of the electronic circuit line 437A can be performed as described herein. The appropriate operating voltage can be selected based on the ratio, and an operation on the electronic device 430 at the electronic circuit line 437A can be performed using the selected operating voltage. Decoder 424 can select a second electronic circuit line, such as electronic circuit line 437B (not shown). The operations to determine the ratio indicative of the RC time constant of the electronic circuit line 437B can be performed. The appropriate operating voltage can be selected based on the new ratio, and an operation on the electronic device 430 at the electronic circuit line 437B can be performed using the selected operating voltage.

In other embodiments, one or more of multiple RC sensor circuits or multiple decoders can be implemented to perform RC time constant extraction of an electronic circuit line in parallel.

Figure 5:
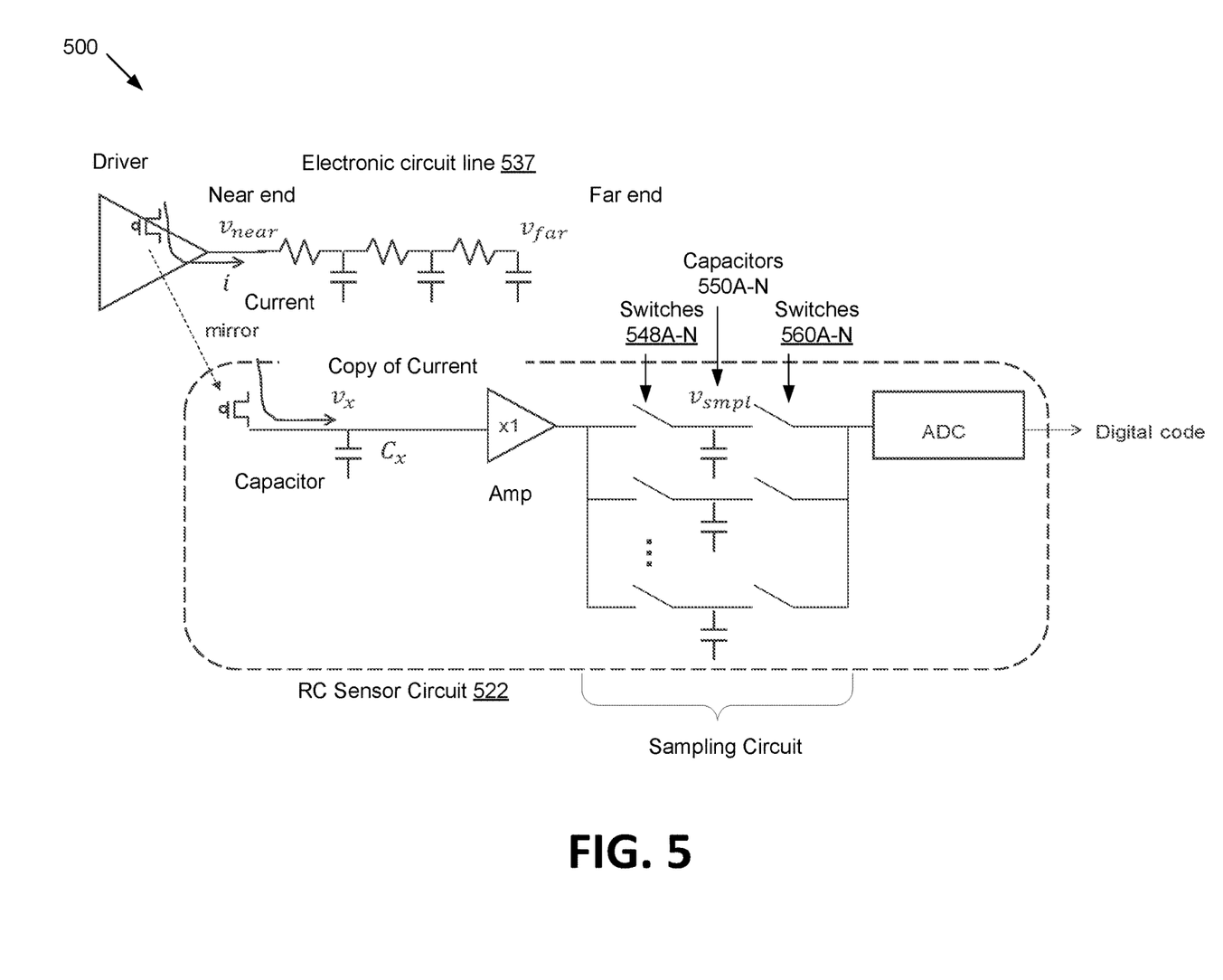
FIG. 5 is a diagram illustrating an RC sensor circuit and an example electronic circuit line, in accordance with some embodiments of the disclosure.

FIG. 5 is a diagram illustrating an RC sensor circuit and an example electronic circuit line, in accordance with some embodiments of the disclosure. Diagram 500 illustrates RC sensor circuit 522 and electronic circuit line 537. Some components of RC sensor circuit 522 are similar to components of RC sensor circuit 222 of FIG. 2, and will not be described again with respect to FIG. 5 for the purposes of clarity. The components of electronic circuit line 537 are similar to components of electronic circuit line 237 of FIG. 2, and will not be described again with respect to FIG. 5 for purposes of clarity.

RC sensor circuit 522 includes a sampling circuit that includes multiple sampling capacitors 550A-N, multiple switches 548A-N preceding the sampling capacitors 550A-N, and multiple switches 560A-N following the sampling capacitors 550A-N. Each row of the sampling circuit (e.g., switch 548A, sampling capacitor 550, and switch 560A) can sample a voltage (e.g., Vx) at the integration capacitor (Cx) at different times. In some embodiments, the sampling times can be relatively close such that the voltage (e.g., Vx) at the integration capacitor can be sampled multiple time before the voltage (e.g., Vx) reaches a steady-state voltage. The multiple sampled voltages can be stored at the respective sampling capacitors 550A-N. The stored voltages can be sent to the ADC in a serial manner by operating switches 560A-N, accordingly. In some embodiments, at least one of the sampled voltages can be a voltage (Vx) that is at or near a steady-state voltage (e.g., t is very large).

In some embodiments, the multiple sample voltages can be used to generate multiple ratios. For example, a ratio can be generated between each of the sampled voltages and the last sampled voltage (e.g., the sampled voltage at or near the steady-state voltage). The ratios can be used as points in a fitted curve. One or more best fit curve techniques can be used such as the best least square curve fit. The RC time constant can be extrapolated from the fitted curve.

Figure 6:
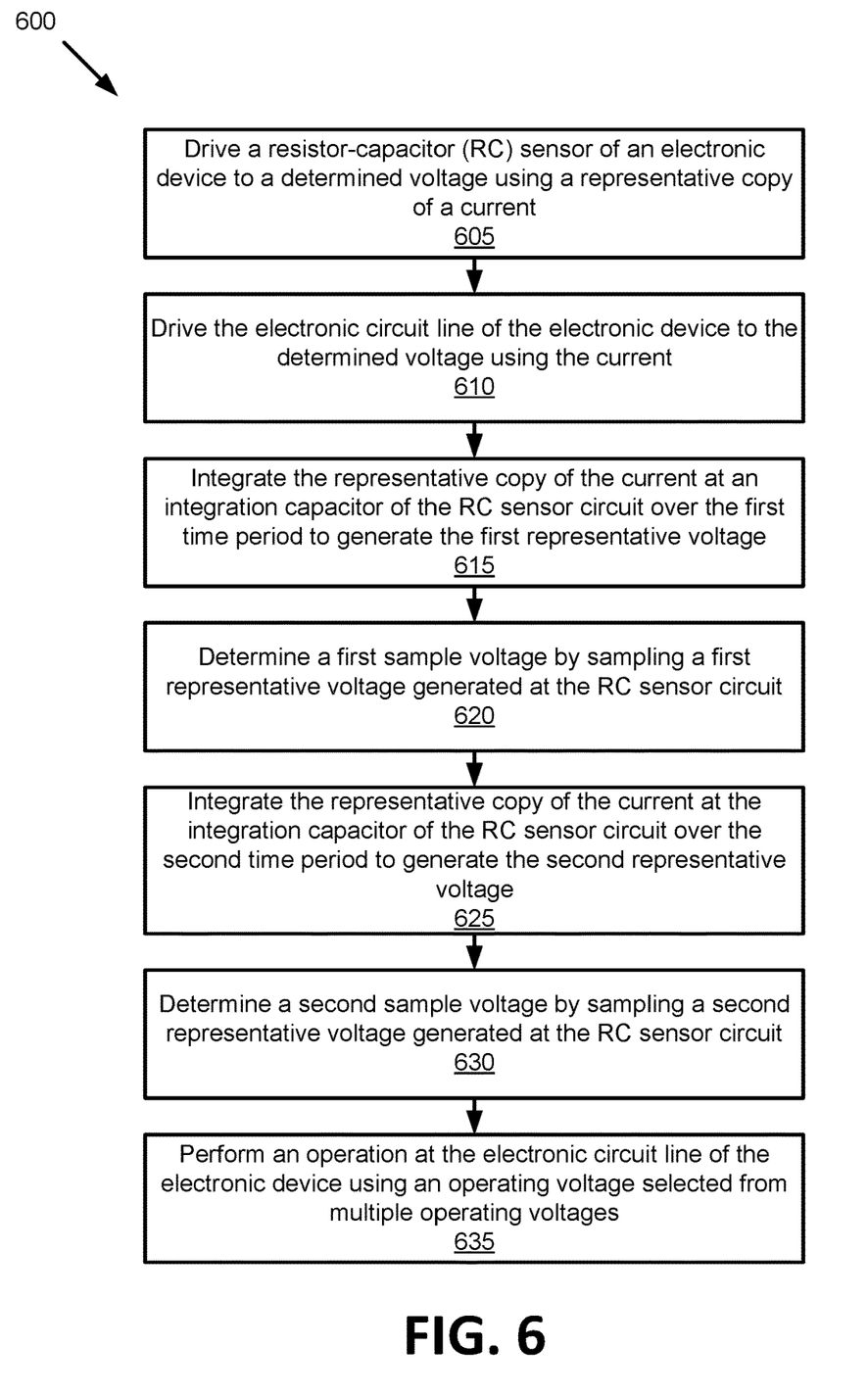
FIG. 6 is a flow diagram of an example method of extracting the RC time constant of an electronic circuit line, in accordance with embodiments of the disclosure.

FIG. 6 is a flow diagram of an example method of extracting the RC time constant of an electronic circuit line, in accordance with embodiments of the disclosure. Method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 600 is performed by RC time constant manager 113 of FIG. 1. Although shown in a particular sequence or order, unless otherwise specified, the sequence or order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other process flows are possible. In some embodiments, the same, different, greater, or fewer operations can be performed.

At operation 605, processing logic drives a resistor-capacitor (RC) sensor of an electronic device to a drive voltage using a representative copy of a current. The current can drive an electronic circuit line of the electronic device. The RC sensor circuit can sample voltages that are indicative of an RC time constant of the electronic circuit line.

In some embodiments, the electronic circuit line includes a first end and a second end that is opposite the first end. A driver circuit is coupled to the first end to drive the second end to the drive voltage using the current. The second end in inaccessible for measurement of the drive voltage.

At operation 610, processing logic drives the electronic circuit line of the electronic device to the drive voltage using the current. In some embodiments, processing logic drives the electronic circuit line concurrently with driving the RC sensor circuit. In other embodiments, processing logic does not drive the electronic circuit line and the RC sensor circuit concurrently. In still other embodiments, processing logic does not drive the electronic circuit line.

At operation 615, processing logic integrates the representative copy of the current at an integration capacitor of the RC sensor circuit over the first time period to generate the first representative voltage.

At operation 620, processing logic determines a first sample voltage by sampling a first representative voltage generated at the RC sensor circuit. Sampling the first representative voltage can be performed at least in part by driving the RC sensor circuit with the representative copy of the current over a first time period. The representative voltage can represent the voltage that is being generated at the far end of the electronic circuit line.

At operation 625, processing logic integrates the representative copy of the current at the integration capacitor of the RC sensor circuit over the second time period to generate the second representative voltage. In some embodiments, the second time period overlaps the first time period.

In some embodiments, to determine the first sample voltage by sampling the first representative voltage generated at the RC sensor circuit, processing logic can amplify the first representative voltage at the integration capacitor to generate the first sample voltage at a sampling capacitor of the RC sensor circuit.

In some embodiments, to determine the second sample voltage by sampling the second representative voltage generated at the RC sensor circuit, processing logic can amplify the second representative voltage at the integration capacitor to generate the second sample voltage at the sampling capacitor of the RC sensor circuit.

At operation 630, processing logic determines a second sample voltage by sampling a second representative voltage generated at the RC sensor circuit. Sampling the second representative voltage can be performed at least in part by driving the RC sensor circuit with the representative copy of the current over a second time period. A ratio of the first sample voltage and the second sample voltage is indicative of the RC time constant of the electronic circuit line.

In some embodiments, the first sample voltage is converted to a first digital code representing the first sample voltage. The second sample voltage is converted to a second digital code representing the second sample voltage. The ratio of the first sample voltage and the second sample voltage is determined using the first digital code and the second digital code.

In some embodiments, the ratio is mapped to a trim voltage (e.g., operating voltage) that is selected to drive the electronic circuit line in view of the RC time constant of the electronic circuit line. In some embodiments, the electronic circuit line includes a wordline of a memory device. The trim voltage is selected to drive the wordline in a performance of a memory operation.

At operation 635, processing logic performs an operation at the electronic circuit line of the electronic device using an operating voltage selected from multiple operating voltages. The operating voltage can be selected based on the ratio that is indicative of the RC time constant of the electronic circuit line.

Figure 7:
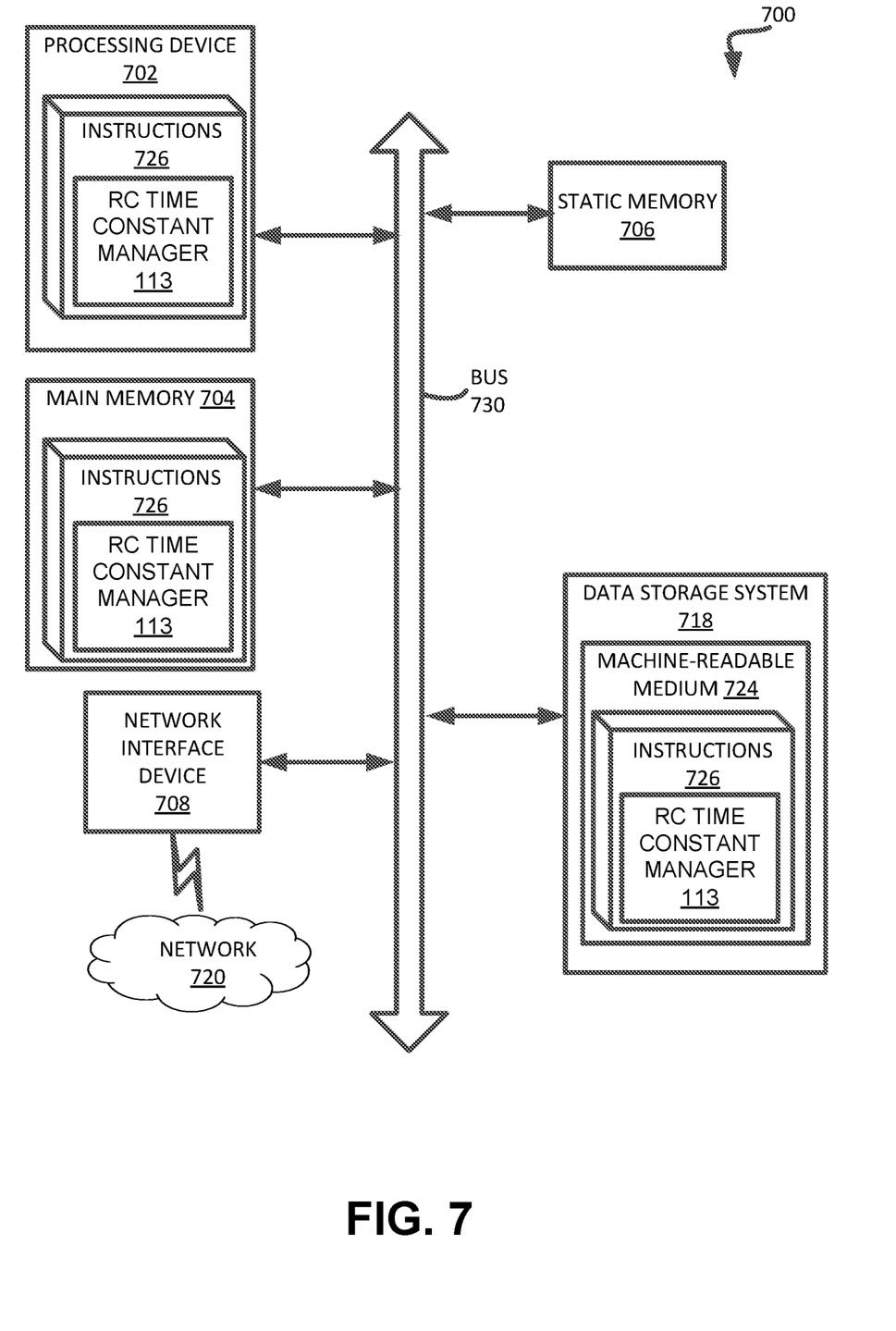
FIG. 7 is a block diagram of an example computer system in which embodiments of the disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to RC time constant manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to RC time constant manager 113 of FIG. 1. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An electronic device, comprising:
    a resistor-capacitor (RC) sensor circuit comprising:
        an integration capacitor configured to integrate a representative copy of a current that drives an electronic circuit line, wherein the integration capacitor is configured to integrate over a first time period to generate a first representative voltage and over a second time period to generate a second representative voltage; and
        a sampling circuit coupled to the integration capacitor and configured to sample the first representative voltage and the second representative voltage, wherein a ratio of the first sampled voltage and the second sampled voltage is indicative of an RC time constant of the electronic circuit line.

2. The electronic device of claim 1, the RC sensor circuit further comprising:
    a driver circuit comprising an output to drive the RC sensor circuit to a drive voltage using the representative copy of the current that drives the electronic circuit line, wherein the integration capacitor is coupled to the output of the drive circuit.

3. The electronic device of claim 2, further comprising:
    the electronic circuit line comprising a first end and a second end that is opposite the first end, wherein the driver circuit is coupled to the first end of the electronic circuit line to drive the second end of the electronic circuit line to the drive voltage using the current.

4. The electronic device of claim 3, wherein the second end of the electronic circuit line is inaccessible for measurement of the drive voltage.

5. The electronic device of claim 1, further comprising:
    an amplifier comprising an input and an output, wherein the input is coupled the integration capacitor, wherein the output is coupled to the sampling circuit.

6. The electronic device of claim 5, wherein the amplifier comprises a unity-gain amplifier.

7. The electronic device of claim 5, wherein the sampling circuit comprises:
    a switch comprising a first end and a second end, wherein the first end of the switch is coupled to the output of the amplifier; and
    a sampling capacitor comprising a first terminal and a second terminal, wherein the first terminal of the sampling capacitor is coupled to the second end of the switch, and wherein the second terminal of the sampling capacitor is coupled to a ground potential.

8. The electronic device of claim 2, wherein the driver circuit comprises a current mirror circuit, wherein the driver circuit to drive the current at the electronic circuit line and the representative copy of the current at the RC sensor circuit.

9. The electronic device of claim 1, wherein the electronic device is configured to perform an operation at the electronic circuit line of the electronic device using an operating voltage selected from a plurality of operating voltages, wherein the operating voltage is selected based on the ratio that is indicative of the RC time constant.

10. The electronic device of claim 1, wherein the electronic circuit line comprises a wordline of a memory device.

11. The electronic device of claim 10, wherein the ratio is mapped to a trim voltage, wherein the trim voltage is selected to drive the wordline in a performance of a memory operation.

12. A system comprising:
    an electronic circuit line; and
    a resistor-capacitor (RC) sensor circuit, coupled to the electronic circuit line, the RC sensor circuit comprising:
        an integration capacitor configured to integrate a representative copy of a current that drives the electronic circuit line, wherein the integration capacitor is configured to integrate over a first time period to generate a first representative voltage and over a second time period to generate a second representative voltage; and
        a sampling circuit coupled to the integration capacitor and configured to sample the first representative voltage and the second representative voltage, wherein a ratio of the first sampled voltage and the second sampled voltage is indicative of an RC time constant of the electronic circuit line.

13. The system of claim 12, the RC sensor circuit further comprising:
    a driver circuit comprising an output to drive the RC sensor circuit to a drive voltage using the representative copy of the current that drives the electronic circuit line, wherein the integration capacitor is coupled to the output of the drive circuit.

14. The system of claim 13, wherein the electronic circuit line comprises a first end and a second end that is opposite the first end of the electronic circuit line, wherein the driver circuit is coupled to the first end of the electronic circuit line to drive the second end of the electronic circuit line to the drive voltage using the current.

15. The system of claim 14, wherein the second end of the electronic circuit line is inaccessible for measurement of the drive voltage.

16. The system of claim 12, further comprising:
an amplifier comprising an input and an output, wherein the input is coupled to the integration capacitor, wherein the output is coupled to the sampling circuit.

17. The system of claim 16, wherein the sampling circuit comprises:
a switch comprising a first end and a second end, wherein the first end of the switch is coupled to the output of the amplifier; and
a sampling capacitor comprising a first terminal and a second terminal, wherein the first terminal of the sampling capacitor is coupled to the second end of the switch, and wherein the second terminal of the sampling capacitor is coupled to a ground potential.

18. The system of claim 13, wherein the driver circuit comprises a current mirror circuit, wherein the driver circuit to drive the current at the electronic circuit line and the representative copy of the current at the RC sensor circuit.

19. The system of claim 12, wherein the system is configured to perform an operation at the electronic circuit line using an operating voltage selected from a plurality of operating voltages, wherein the operating voltage is selected based on the ratio that is indicative of the RC time constant.

20. The system of claim 12, wherein the electronic circuit line comprises a wordline of a memory device.

\* \* \* \* \*